(12) United States Patent
Park et al.

(10) Patent No.: US 9,645,434 B2
(45) Date of Patent: May 9, 2017

(54) TRANSPARENT DISPLAY DEVICE AND MANUFACTURING METHOD THEREOF

(71) Applicant: LG Display Co., Ltd., Seoul (KR)

(72) Inventors: Ju-Un Park, Paju-si (KR); Won-Ho Lee, Paju-si (KR); Tae-Han Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 47 days.

(21) Appl. No.: 14/292,521

(22) Filed: May 30, 2014

(65) Prior Publication Data

US 2015/0098039 A1    Apr. 9, 2015

(30) Foreign Application Priority Data

Oct. 8, 2013 (KR) .......................... 10-2013-0119810

(51) Int. Cl.
  *G02F 1/1343* (2006.01)
  *G02F 1/1335* (2006.01)
  *H01L 27/12* (2006.01)

(52) U.S. Cl.
  CPC .. *G02F 1/133504* (2013.01); *G02F 1/133502* (2013.01); *G02F 1/134363* (2013.01); *H01L 27/1262* (2013.01)

(58) Field of Classification Search
  None
  See application file for complete search history.

(56) References Cited

U.S. PATENT DOCUMENTS

| 6,222,599 B1* | 4/2001 | Yoshida | G02F 1/134363 |
| | | | 349/106 |
| 2001/0010575 A1 | 8/2001 | Yoshida et al. | |
| 2004/0080699 A1 | 4/2004 | Lee | |
| 2006/0139544 A1* | 6/2006 | Ko | G02F 1/134363 |
| | | | 349/141 |
| 2009/0262287 A1 | 10/2009 | Nishida | |
| 2010/0188634 A1* | 7/2010 | Konno | G02F 1/134363 |
| | | | 349/187 |

(Continued)

FOREIGN PATENT DOCUMENTS

| CN | 101122723 A | 2/2008 |
| CN | 101495910 A | 7/2009 |
| TW | 476859 B | 2/2002 |

*Primary Examiner* — Dung Nguyen
*Assistant Examiner* — Shan Liu
(74) *Attorney, Agent, or Firm* — Birch, Stewart, Kolasch & Birch, LLP

(57) ABSTRACT

Discussed are a transparent display device and a manufacturing method thereof, which may reduce diffraction grating. The transparent display device includes gate lines and data lines formed on a substrate and crossing each other with a gate insulator film interposed therebetween to define pixel areas, common lines formed on the substrate and being parallel to the gate lines, thin film transistors formed in the respective pixel areas, pixel electrodes connected to the thin film transistors, and common electrodes connected to the common lines and alternating with the pixel electrodes. In the transparent display device, blocks between the pixel electrodes and the common electrodes are reduced or increased in width by an equal difference with increasing distance from both edges of each pixel area proximate to the data lines or by an equal difference with decreasing distance to the center of the pixel area.

11 Claims, 16 Drawing Sheets

(56) References Cited

U.S. PATENT DOCUMENTS

2011/0242443 A1\* 10/2011 Choi ................. C08G 8/12
  349/38
2012/0327352 A1\* 12/2012 Uyama ............ G02F 1/134363
  349/141

\* cited by examiner

TRANSPARENT DISPLAY DEVICE AND MANUFACTURING METHOD THEREOF

This application claims the benefit of Korean Patent Application No. 10-2013-0119810, filed in the Republic of Korea on Oct. 8, 2013, which is hereby incorporated by reference as if fully set forth herein.

BACKGROUND OF THE INVENTION

Field of the Invention

The present invention relates to a transparent display device, and more particularly to a transparent display device which may improve visibility owing to improved diffraction and a manufacturing method thereof.

Discussion of the Related Art

Development of an information-oriented society is gradually increasing demands for display devices in various forms. Accordingly, various flat panel display devices, such as Liquid Crystal Display (LCD), Plasma Display Panel (PDP), Electro Luminescent Display (ELD), Vacuum Fluorescent Display (VFD) devices, and the like, have recently been studied. Some of these mentioned devices have already been utilized as display devices for various facilities.

Lately, in particular, transparent display devices, which are capable of displaying images while allowing an object at the rear thereof to be viewed, have actively been studied. By applying these transparent display devices to the windshield of a car, a glass of home appliances, and the like, provision of information is possible.

FIGS. 1A and 1B are respectively a perspective view and a photograph showing a transparent display device used in an application apparatus according to a related art, and FIG. 2 is photograph of the transparent display device having a diffraction grating according to the related art.

In the case in which the transparent display device 10, which includes an upper polarizer plate 10b, a liquid crystal panel 10a, and a lower polarizer plate 10c is applied to an application apparatus 20, such as a cooler door, as exemplarily shown in FIG. 1A, the transparent display device 10 is adapted to display images while allowing an object at the rear thereof to be viewed under the assistance of light inside the application apparatus 20.

The transparent display device 10 includes a plurality of pixel areas containing a regular array of lines and electrodes, the lines and the electrodes serving as a diffraction grating. More specifically, when the pixel areas of the transparent display device 10 are driven in an in-plane switching mode in which pixel electrodes and common electrodes alternate with each other to generate a transverse field, the pixel electrodes and the common electrodes arranged in parallel causes diffraction grating depending on wavelengths of light as light inside the application apparatus 20 passes through the display device 10. Severe diffraction grating, as exemplarily shown in FIG. 2, generates rainbow-colored spots due to mixing of several wavelengths of light, which causes boundaries of objects inside the application apparatus to appear blurry and also causes ghosting.

SUMMARY OF THE INVENTION

Accordingly, the present invention is directed to a transparent display device and a manufacturing method thereof that substantially obviate one or more problems due to limitations and disadvantages of the related art.

An object of the present invention is to provide a transparent display device in which blocks between pixel electrodes and common electrodes of pixel areas are increased and reduced in width by an equal difference to improve diffraction, thus achieving improved visibility, and a manufacturing method thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a transparent display device in one embodiment includes gate lines and data lines formed on a substrate, the gate lines and the data lines crossing each other with a gate insulator film interposed therebetween to define pixel areas, common lines formed on the substrate, the common lines being parallel to the gate lines, thin film transistors formed in the respective pixel areas, pixel electrodes connected to the thin film transistors, and common electrodes connected to the common lines, the common electrodes alternating with the pixel electrodes, wherein blocks between the pixel electrodes and the common electrodes are reduced or increased in width by an equal difference with increasing distance from both edges of each pixel area proximate to the data lines or with decreasing distance to the center of the pixel area.

In accordance with another aspect of the invention, a manufacturing method of a transparent display device, includes forming gate lines and common lines on a substrate, the gate lines and the common lines being parallel to each other, forming a gate insulator film on the substrate to cover the gate lines and the common lines, forming data lines on the gate insulator film, the data lines crossing the gate lines to define pixel areas, forming thin film transistors in the respective pixel areas, forming pixel electrodes connected to the thin film transistors, and forming common electrodes connected to the common lines, the common electrodes alternating with the pixel electrodes, wherein blocks between the pixel electrodes and the common electrodes are reduced or increased in width by an equal difference with increasing distance from both edges of each pixel area proximate to the data lines or with decreasing distance to the center of the pixel area.

The blocks between the pixel electrodes and the common electrodes may be symmetrical on the basis of the center between the two data lines proximate to both edges of the pixel area.

The equal difference may be in a range of 0.5 µm to 1 µm.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the invention. In the drawings.

DETAILED DESCRIPTION OF THE INVENTION

Hereinafter, a transparent display device according to the present invention will be described in detail with reference to the accompanying drawings.

Figure 1A:
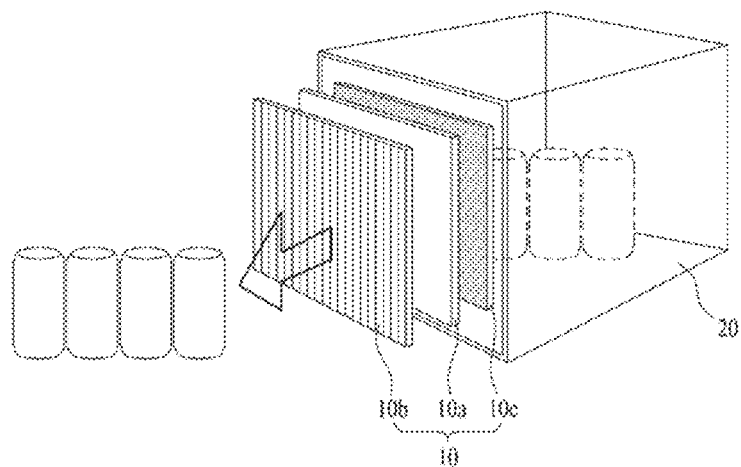
FIGS. 1A and 1B are respectively a perspective view and a photograph showing a transparent display device used in an application apparatus according to a related art.
Figure 1B:
Figure 2:
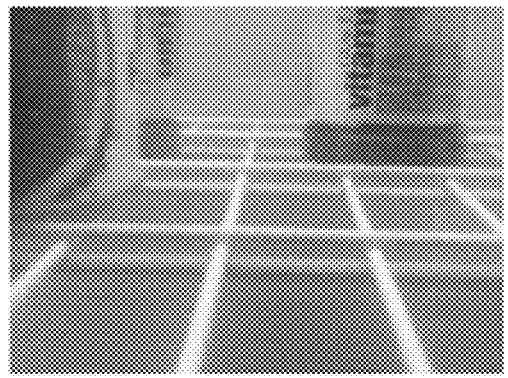
FIG. 2 is photograph of the transparent display device under occurrence of diffraction grating according to the related art.
Figure 3A:
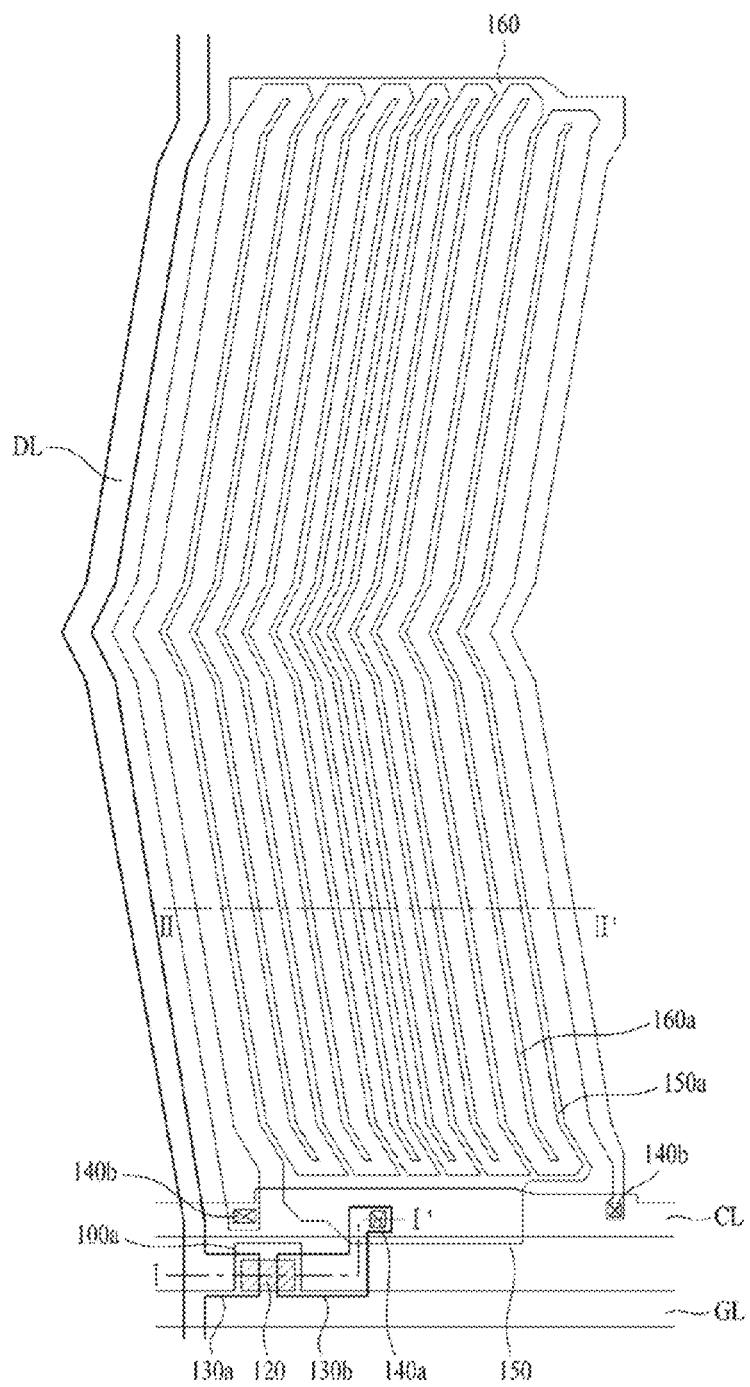
FIG. 3A is a plan view of a transparent display device according to an embodiment of the present invention.
Figure 3B:
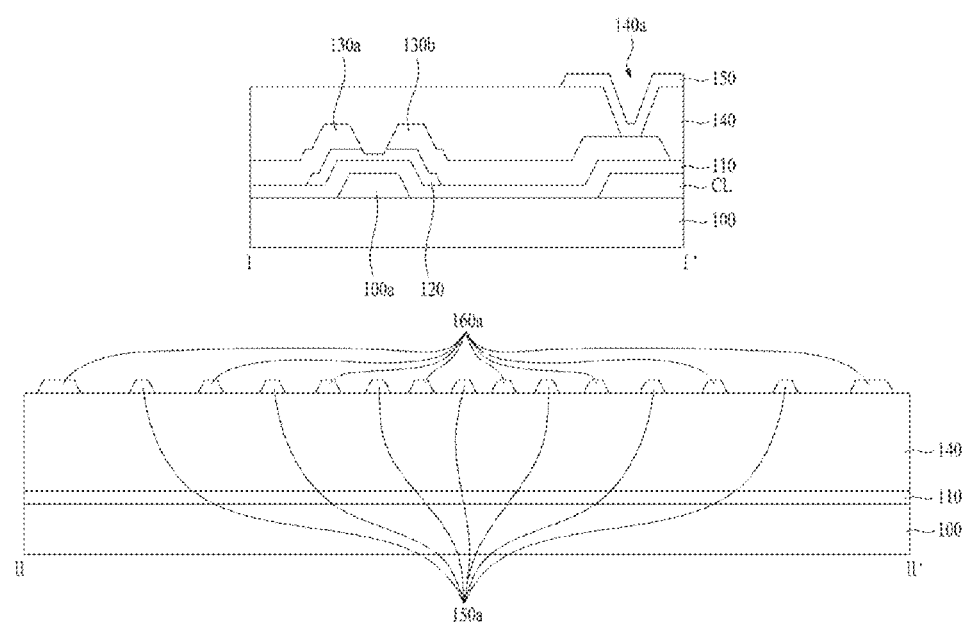
FIG. 3B is a sectional view taken along I-I' and II-II' of FIG. 3A.

FIG. 3A is a plan view of a transparent display device according to the present invention, and FIG. 3B is a sectional view taken along I-I' and II-II' of FIG. 3A.

As exemplarily shown in FIGS. 3A and 3B, the transparent display device of the present invention includes, disposed on a substrate 100, gate lines GL and data lines DL crossing each other to define a plurality of pixel areas, common lines CL parallel to the gate lines GL, thin film transistors formed in the respective pixel areas, pixel electrodes 150 connected to the thin film transistors, and common electrodes 160 connected to the common lines CL, the common electrodes 160 and the pixel electrodes 150 alternating with each other to generate a transverse field. In particular, the transparent display device of the present invention includes red pixel areas, green pixel areas, and blue pixel areas, and further includes white pixel areas emitting white light, to achieve improved transmissivity.

Each of the pixel electrodes 150 and the common electrodes 160 includes vertical and horizontal portions. In this case, a block between the vertical portion 150a of the pixel electrode 150 and the vertical portion 160a of the common electrode 160 at the center of each pixel area differs from a block between the vertical portion 150a of the pixel electrode 150 and the vertical portion 160a of the common electrode 160 at the edge of the pixel area. The drawing shows that the block at the center of the pixel area is narrower than the block at the edge of the pixel area proximate to the data line DL, the blocks being reduced in width by an equal difference.

More specifically, a gate electrode 100a, the gate line GL, and the common line CL are formed on the substrate 100. In this case, the common line CL is parallel to the gate line GL. The gate electrode 100a may protrude from one side the gate line GL, or may define a portion of the gate line GL.

A gate insulator film 110 is formed over a surface of the substrate 100 including the gate line GL, the gate electrode 100a, and the common line CL. A semiconductor layer 120 is formed on the gate insulator film 110. The semiconductor layer 120 overlaps the gate electrode 100a, and takes the form of a stack of an active layer and an ohmic contact layer in sequence.

A source electrode 130a protrudes from the data line DL to overlap the semiconductor layer 120. A drain electrode 130b is formed to face the source electrode 130a with a channel of the semiconductor layer 120 interposed therebetween, to supply a pixel signal of the data line DL to the pixel electrode 150.

A protective film 140 is formed over the surface of the substrate 100 to cover a thin film transistor comprised of the gate electrode 100a, the gate insulator film 110, the semiconductor layer 120, the source electrode 130a, and the drain electrode 130b. The protective film 140 has a drain contact hole 140a to expose the drain electrode 130b. The protective film 140 further has a common contact hole 140b formed by selectively removing the drain electrode 130b and the gate insulator film 110 to expose the common line CL. The common contact hole 140b, as exemplarily shown, may be formed at either edge of the pixel area.

The pixel electrode 150 is formed on the protective film 140 and connected to the drain electrode 130b through the drain contact hole 140a. The pixel electrode 150 is formed of a transparent conductive material, such as Tin Oxide (TO), Indium Tin Oxide (ITO), Indium Zinc Oxide (IZO), Indium Tin Zinc Oxide (ITZO), and the like. The pixel electrode 150 includes a pixel horizontal portion which constitutes a storage capacitor in a region overlapping the common line CL, and a plurality of pixel vertical portions 150a protruding from the pixel horizontal portion.

In addition, the common electrode 160 is formed on the protective film 140 using a transparent conductive material as described above. The common electrode 160 is connected to the common line CL through the common contact hole 140b. The common electrode 160 includes a plurality of common vertical portions 160a alternating with the pixel vertical portions 150a, and a common horizontal portion connecting the common vertical portions 160a to one another. The common vertical portions 160a and the pixel vertical portions 150a alternate with each other in the pixel area to generate a transverse field.

In the case in which the transparent display device is used in an application apparatus as described above, the lines and the electrodes of each pixel area of the transparent display device serve as a diffraction grating. In particular, when the pixel area is driven in an in-plane switching mode in which the pixel vertical portions 150a and the common vertical portions 160a alternate with each other to generate a transverse field, the pixel vertical portions 150a and the common vertical portions 160a arranged in parallel cause diffraction depending on wavelengths of light as light inside the application apparatus passes through the display device.

Accordingly, to reduce diffraction grating, the transparent display device of the present invention has a configuration in which blocks between the pixel vertical portions 150a and the common vertical portions 160a are increased or reduced in width by an equal difference with increasing distance from both edges of the pixel area proximate to the data lines DL or with decreasing distance to the center of the pixel area. The drawing shows equal-difference reduction in the width of the blocks.

The magnitude of the equal difference is determined in consideration of transmissivity of the pixel area depending on the width of the blocks between the pixel vertical portions 150a and the common vertical portions 160a. More specifically, transmissivity increases as the blocks become wider, and decreases as the blocks become narrower. Thus, the equal difference may be within a range of 0.5 µm to 1 µm.

As such, on the basis of the center between two data lines Dl proximate to both edges of the pixel area, the blocks between the pixel vertical portions 150a and the common vertical portions 160a are symmetrical.

For example, as exemplarily shown, there may be 14 blocks between the pixel vertical portions 150a and the common vertical portions 160a and the blocks between the pixel vertical portions 150a and the common vertical portions 160a may be reduced in width by an equal difference of 1 µm. In this case, assuming that the width of the block between the outermost pixel vertical portion 150a proximate to the data line DL and the common vertical portion 160a is 12.5 µm, the blocks between the pixel vertical portions 150a and the common vertical portions 160a are reduced in width in the sequence of 11.5 µm, 10.5 µm, 9.5 µm, 8.5 µm, 7.5 µm, and 6.5 µm with decreasing distance to the center between the neighboring data lines DL. Again, the blocks are increased in width in the sequence of 6.5 µm, 7.5 µm, 8.5 µm, 9.5 µm, 10.5 µm, 11.5 µm, and 12.5 µm.

In the case of an equal difference of 0.5 µm, the width of the block between the outermost pixel vertical portion 150a proximate to the data line DL and the common vertical portion 160a may be adjusted to ensure a constant sum of the widths of the blocks between the pixel vertical portions 150a and the common vertical portions 160a in one pixel area. That is, in the case of an equal difference of 0.5 µm, the width of the block between the outermost pixel vertical portion 150a proximate to the data line DL and the common vertical portion 160a may be 11 µm, and the blocks between the pixel vertical portions 150a and the common vertical portions 160a are reduced in width in the sequence of 10.5 µm, 10 µm, 9.5 µm, 9 µm, 8.5 µm, and 8 µm with decreasing distance to the center between the neighboring data lines DL. Again, the blocks are increased in width in the sequence of 8 µm, 8.5 µm, 9 µm, 9.5 µm, 10 µm, 10.5 µm, and 11 µm.

Accordingly, the transparent display device of the present invention described above causes offset interference between the pixel vertical portions 150a and the common vertical portions 160a when viewing an internal material through the transparent display device under the assistance of lighting inside the application apparatus. This reduces diffraction grating, thus improving diffraction of the transparent display device and visibility.

Figure 4A:
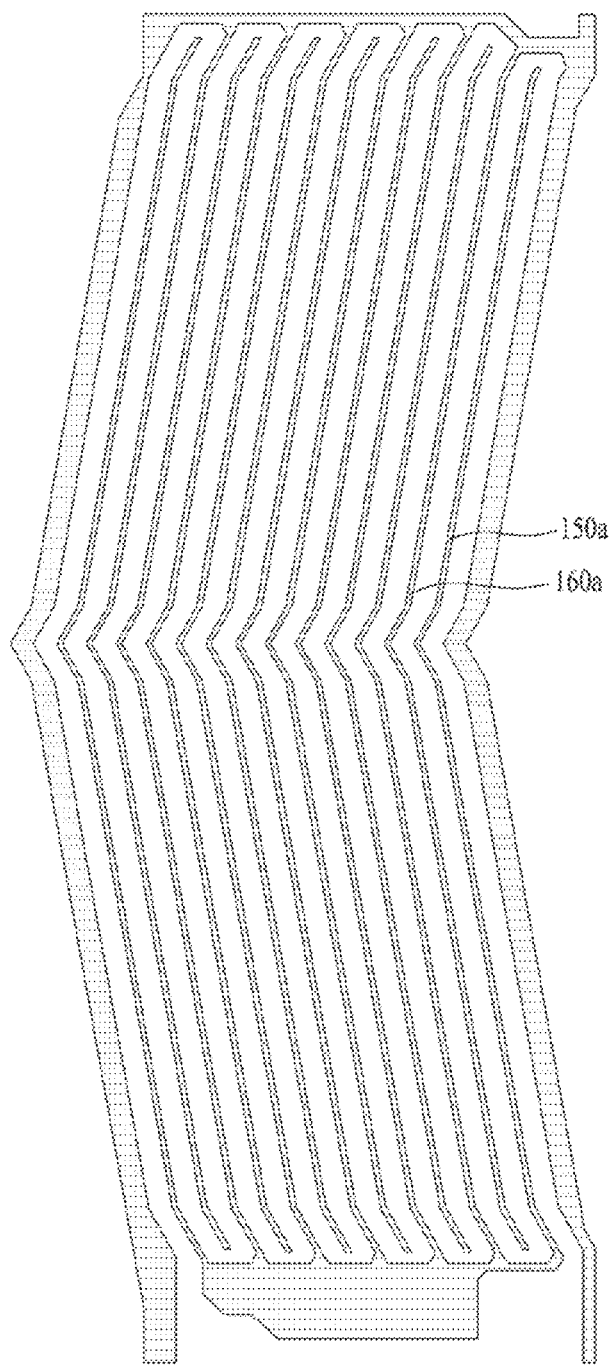
FIG. 4A is a plan view of a typical transparent display device.
Figure 4B:
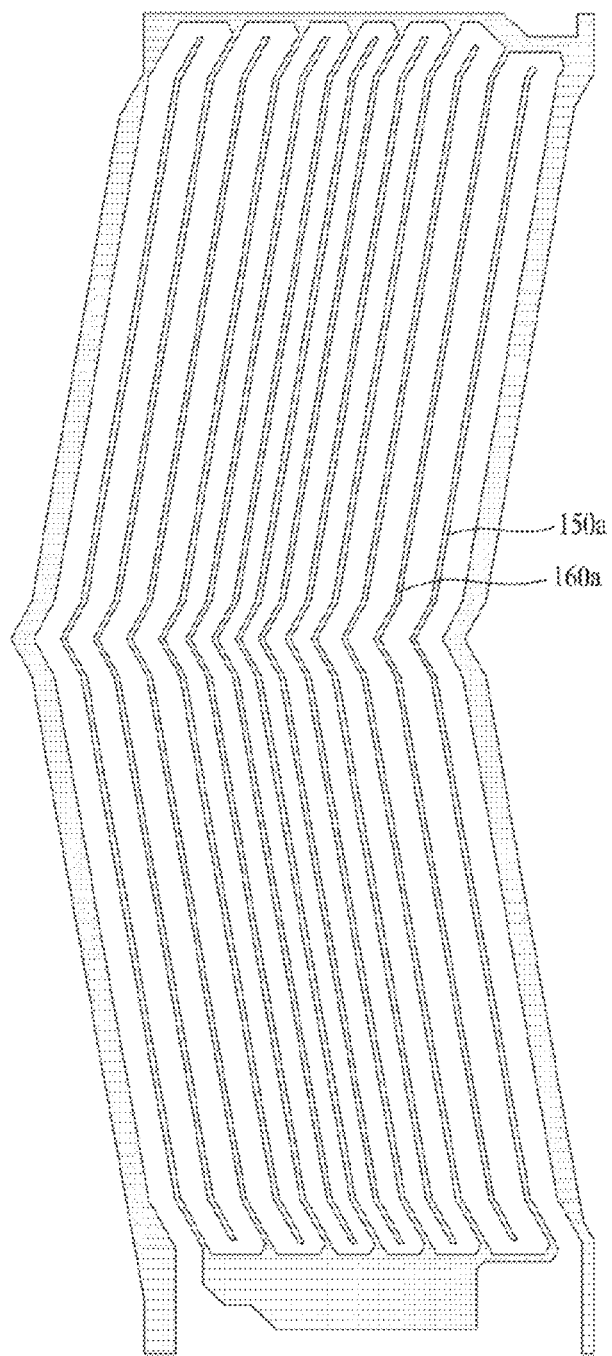
FIGS. 4B and 4C are plan views of the transparent display device of the present invention.
Figure 4C:
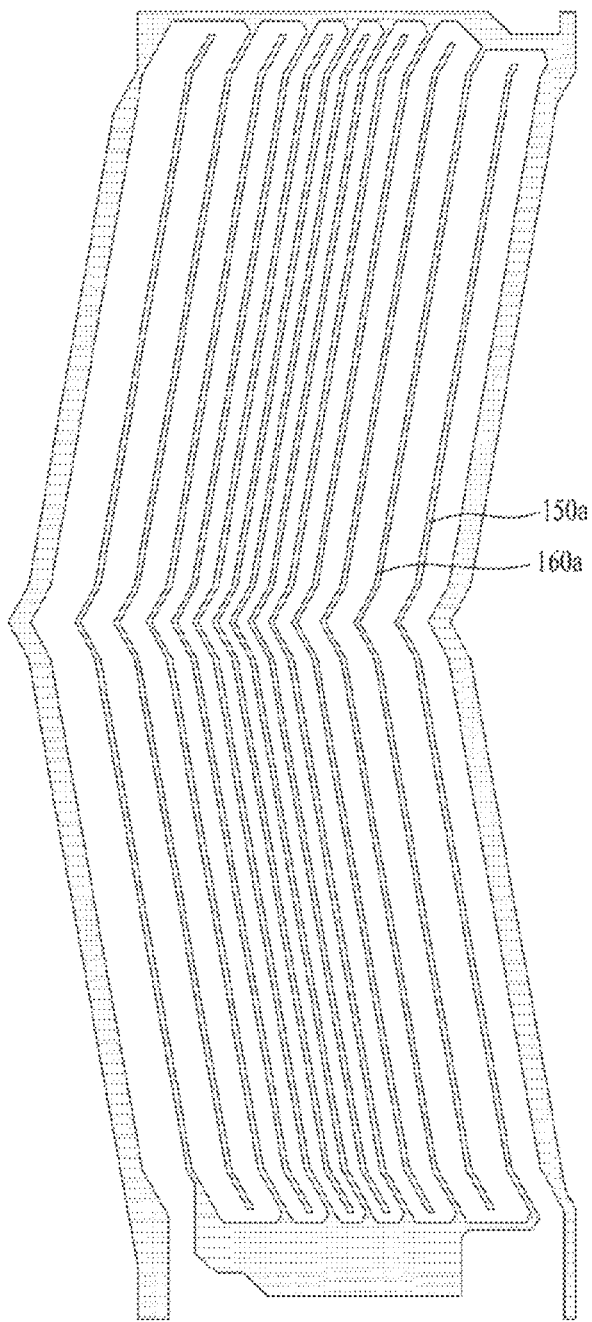

FIG. 4A is a plan view of the typical transparent display device, and FIGS. 4B and 4C are plan views of the transparent display device of the present invention. In FIGS. 4A to 4C, only the pixel electrode and the common electrode are shown. In addition, Table 1 shows characteristics of the transparent display devices shown in FIGS. 4A to 4C.

TABLE 1

|  | Typical Transparent Display Device (Constant Block Width) | Transparent Display Device of the Present Invention (Blocks with equal difference of 0.5 µm) | Transparent Display Device of the Present Invention (Blocks with equal difference of 1 µm) |
| --- | --- | --- | --- |
| Electrode Width | 2.2 µm | 2.2 µm | 2.2 µm |
| Block Width | 9.51 µm | Equal-difference Reduction of 0.5 µm | Equal-difference Reduction of 1 µm |
| Number of Blocks | 14 ea | 14 ea | 14 ea |
| Opening Rate | 66.5% | 66.5% | 66.5% |

The transparent display device of FIG. 4A has constant-width blocks between the pixel vertical portions 150a and the common vertical portions 160a. FIG. 4B shows a transparent display device in which the blocks between the pixel vertical portions 150a and the common vertical portions 160a are reduced in width by an equal difference of 0.5 µm, and FIG. 4C shows a transparent display device in which the blocks between the pixel vertical portions 150a and the common vertical portions 160a are reduced in width by an equal difference of 1 µm.

In this case, when the blocks between the pixel vertical portions 150a and the common vertical portions 160a are reduced in width by an equal-difference as exemplarily shown in FIGS. 4B and 4C, the number of the pixel vertical portions 150a and the common vertical portions 160a and the sum of the widths of the blocks between the pixel vertical portions 150a and the common vertical portions 160a in one pixel area may vary, differently from those in the typical transparent display device. This may result in variation in the opening rate and display characteristics of the transparent display device. Thus, to prevent this problem, under the condition in which the blocks between pixel vertical portions 150a and the common vertical portions 160a have different widths, it is desirable to adjust the width of the block between the outermost pixel vertical portion 150a proximate to the data line DL and the common vertical portion 160a.

More specifically, the transparent display device of FIG. 4A has 14 blocks between the pixel vertical portions 150a and the common vertical portions 160a and these blocks have the same width of 9.51 µm. Thus, the sum of the widths of the blocks is 9.51×14=133.14 µm. When the blocks between the pixel vertical portions 150a and the common vertical portions 160a are reduced in width by an equal-difference of 0.5 µm as exemplarily shown in FIG. 4B, it is desirable to adjust the width of the block between the outermost pixel vertical portion 150a proximate to the data line DL and the common vertical portion 160a to 11 µm, in order to maintain a constant sum of the width of the blocks between the pixel vertical portions 150a and the common vertical portions 160a.

That is, in the transparent display device of FIG. 4B, the blocks between the pixel vertical portions 150a and the common vertical portions 160a are reduced in width in the sequence of 11 µm, 10.5 µm, 10 µm, 9.5 µm, 9 µm, 8.5 µm, and 8 µm with increasing distance from the outermost region of the pixel area proximate to the data line DL or with decreasing distance to the center of the pixel area. Again, the blocks are increased in width in the sequence of 8 µm, 8.5 µm, 9 µm, 9.5 µm, 10 µm, 10.5 µm, and 11 µm. Thus, the sum of the widths of the blocks between the pixel vertical portions 150a and the common vertical portions 160a is 133 µm.

Similarly, even when the blocks between the pixel vertical portions 150a and the common vertical portions 160a are reduced in width by an equal-difference of 1 µm as exemplarily shown in FIG. 4C, the blocks between the pixel vertical portions 150a and the common vertical portions 160a are reduced in width in the sequence of 12.5 µm, 11.5 µm, 10.5 µm, 9.5 µm, 8.5 µm, 7.5 µm, and 6.5 µm with increasing distance from the region proximate to the data line DL or with decreasing distance to the center. Again, the blocks are increased in the sequence of 6.5 µm, 7.5 µm, 8.5 µm, 9.5 µm, 10.5 µm, 11.5 µm, and 12.5 µm. Thus, the sum of the widths of the blocks between the pixel vertical portions 150a and the common vertical portions 160a is 133 µm.

In conclusion, equal-difference reduction in the widths of the blocks between the pixel vertical portions 150a and the common vertical portions 160a may maintain a constant number of blocks between the pixel vertical portions 150a and the common vertical portions 160a and a constant opening rate, which may prevent variation in display characteristics.

In particular, different widths of the blocks between the pixel vertical portions 150a and the common vertical portions 160a may cause variation in rotation of liquid crystal molecules between the pixel vertical portions 150a and the common vertical portions 160a. Thus, the transparent display device of the present invention may offset drive voltage differences of liquid crystal molecules.

In addition, it is desirable to adjust the width of the block between the outermost pixel vertical portion 150a proximate to the data line DL and the common vertical portion 160a, to ensure a constant sum of the widths of the blocks between the pixel vertical portions 150a and the common vertical portions 160a when the blocks between the pixel vertical portions 150a and the common vertical portions 160a are increased in width by an equal-difference.

Figure 5A:
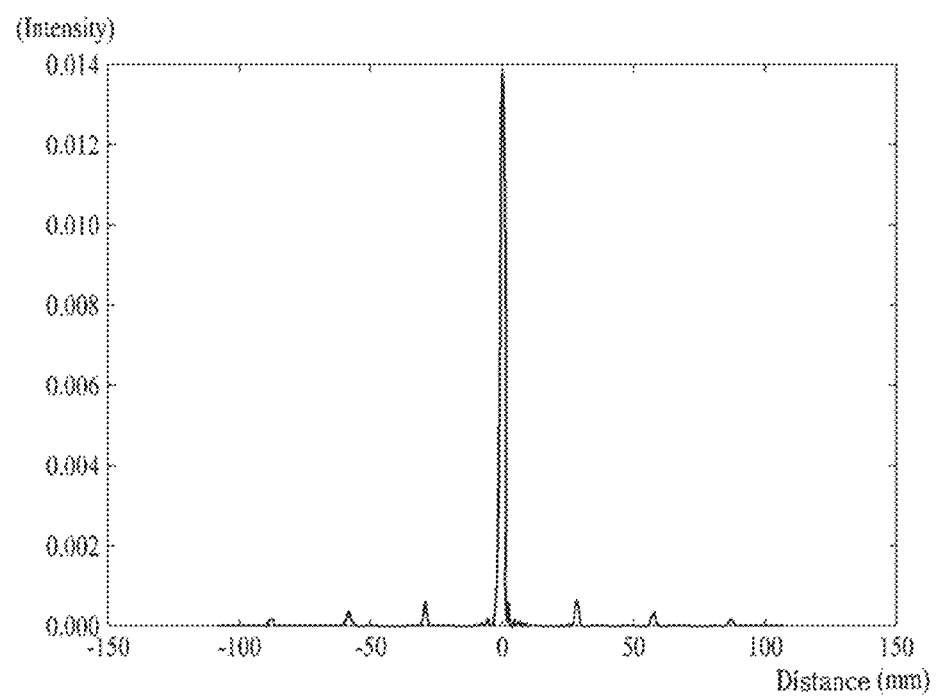
FIGS. 5A to 5C are graphs showing peak intensity of the transparent display devices of FIGS. 4A to 4C, respectively.
Figure 5B:
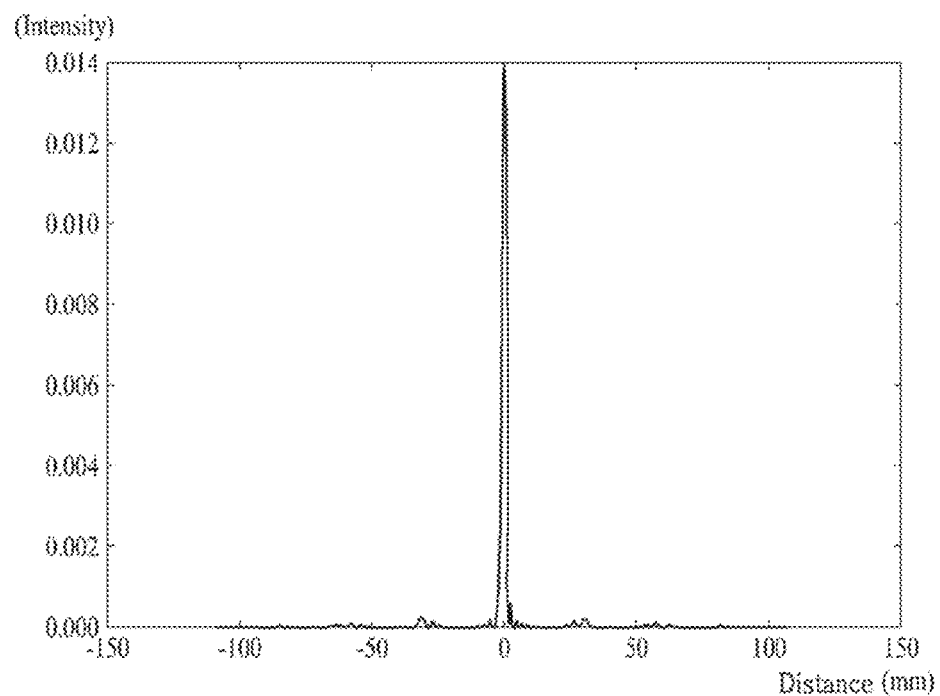
Figure 5C:
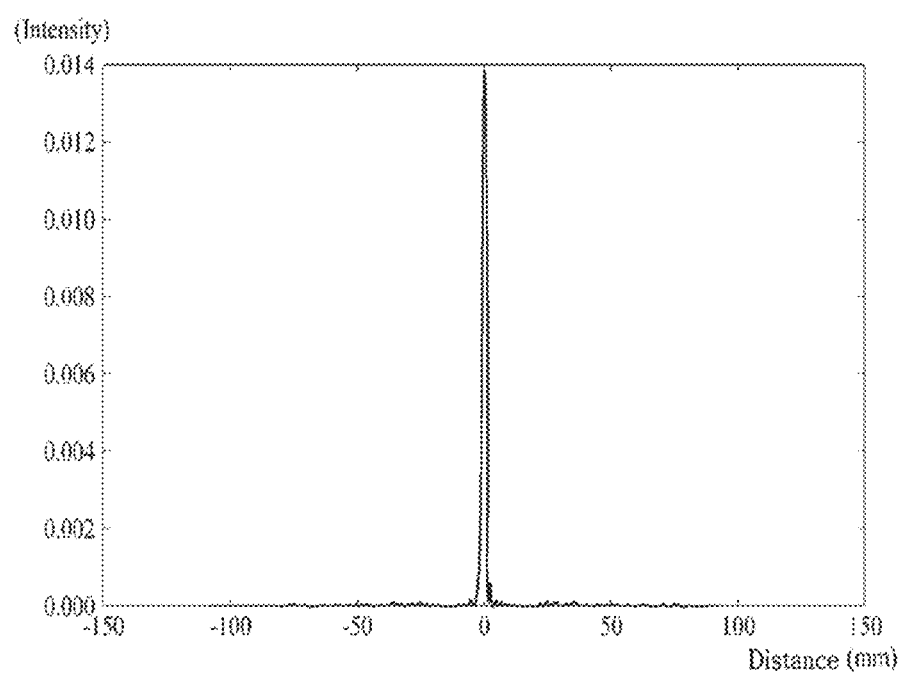
Figure 6:
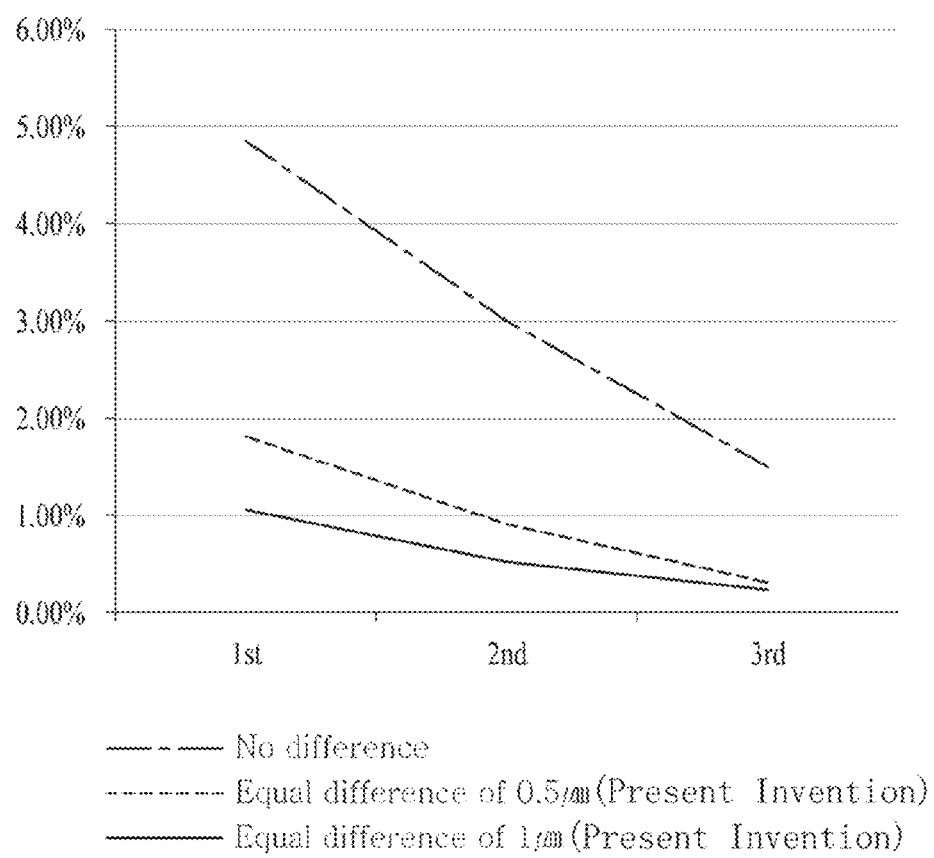
FIG. 6 is a comparative graph of diffraction degrees of FIGS. 4A to 4C.

FIGS. 5A to 5C are graphs showing peak intensity of the transparent display devices of FIGS. 4A to 4C, respectively, and FIG. 6 is a comparative graph of diffraction degrees of FIGS. 4A to 4C.

As exemplarily shown in FIG. 5A, when the blocks between the pixel vertical portions 150a and the common vertical portions 160a have a constant width, diffraction peak based on distance occurs. This causes boundaries of objects inside the application apparatus to appear blurry and also causes ghosting. On the other hand, as exemplarily shown in FIGS. 5B and 5C according to the present invention, when the blocks between the pixel vertical portions 150a and the common vertical portions 160a are reduced in width by an equal-difference, offset interference between the pixel vertical portions 150a and the common vertical portions 160a occurs. This reduces diffraction peak. Thus, as exemplarily shown in FIG. 6, diffraction is reduced, thus providing the transparent display device with improved diffraction and improved visibility.

Hereinafter, a manufacturing method of a transparent display device according to the present invention will be described in detail with reference to the accompanying drawings.

FIGS. 7A to 7D are sectional views showing the sequence of a manufacturing method of a transparent display device according to the present invention.

Figure 7A:
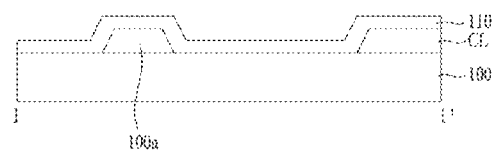
FIGS. 7A to 7D are sectional views showing the sequence of a manufacturing method of a transparent display device according to an embodiment of the present invention.
Figure 7A:

As exemplarily shown in FIG. 7A, an opaque conductive material layer is deposited on the substrate 100 via sputtering, for example. The opaque conductive material layer may be a stack of two or more layers, such as Al/Cr, Al/Mo, Al(Nd)/Al, Al(Nd)/Cr, Mo/Al(Nd)/Mo, Cu/Mo, Ti/Al(Nd) Ti, Mo/Al, Mo/Ti/Al(Nd), Cu-alloy/Mo, Cu-alloy/Al, Cu-alloy/Mo-alloy, Cu-alloy/Al-alloy, Al/Mo-alloy, Mo-alloy/Al, Al-alloy/Mo-alloy, Mo-alloy/Al-alloy, Mo/Al-alloy layers, and the like, or may be a single layer, such as a Mo, Ti, Cu, AlNd, Al, Cr, Mo-alloy, Cu-alloy, Al-alloy layer, and the like.

Then, the opaque conductive material layer is patterned to form the gate electrode 100a, the gate line GL, and the common line CL. The gate line GL and the common line CL are parallel to each other. Although the gate electrode 100a may define a portion of the gate line GL, the drawing shows the gate electrode 100a as protruding from one side of the gate line GL. Then, the gate insulator film 110 is formed over the surface of the substrate 100 including the gate line GL, the gate electrode 100a, and the common line CL.

Figure 7B:
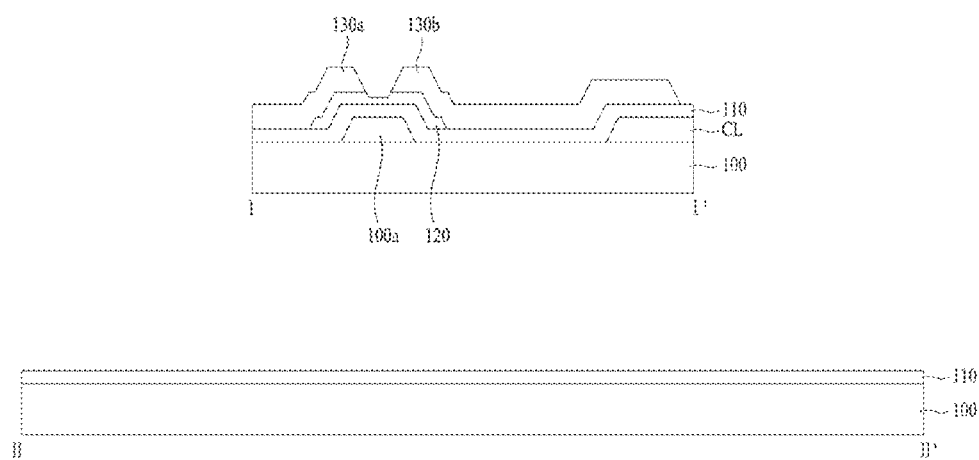

Next, as exemplarily shown in FIG. 7B, the semiconductor layer 120, the data line DL, the source electrode 130a, and the drain electrode 130b are formed on the gate insulator film 110. The semiconductor layer 120 is a stack of the active layer and the ohmic contact layer in sequence. The data line DL crosses the gate line GL with the gate insulator film 110 interposed therebetween to define pixel areas. The source electrode 130a protrudes from the data line DL to thereby be formed on the semiconductor layer 120. The drain electrode 130b faces the source electrode 130a with the channel of the semiconductor layer (not shown) interposed therebetween, the channel being formed by removing the ohmic contact layer.

Figure 7C:
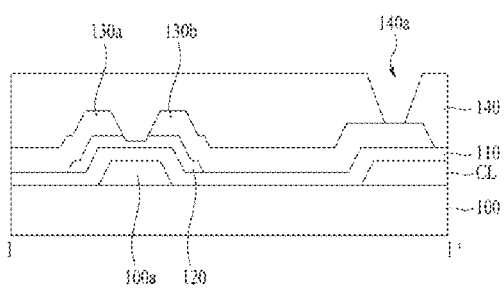
Figure 7C:
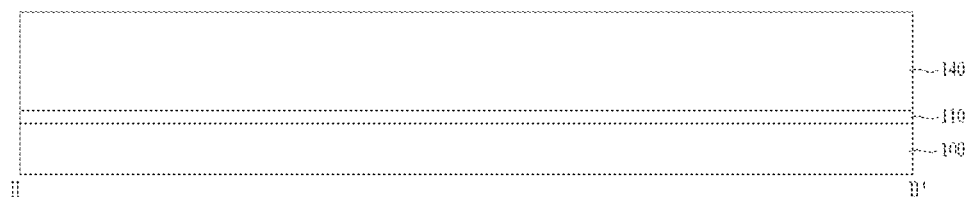

Next, as exemplarily shown in FIG. 7C, the protective film 140 is formed to cover the thin film transistor comprised of the gate electrode 100a, the gate insulator film 110, the semiconductor layer 120, the source electrode 130a, and the drain electrode 130b. Although not shown, the protective film 140 may be a stack of an inorganic protective film and an organic protective film in sequence. The drain contact hole 140a to expose the drain electrode 130b is formed by selectively removing the protective film 140, and simultaneously the common contact hole 140b to expose the common line CL is formed by selectively removing the protective film 140 and the gate insulator film 100.

Figure 7D:
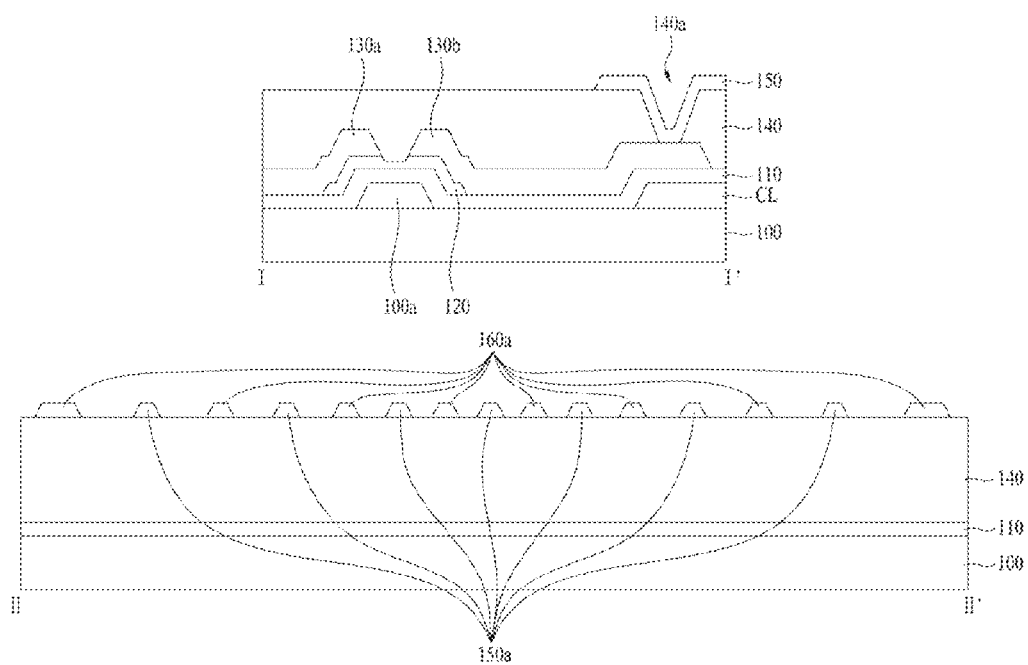

As exemplarily shown in FIG. 7D, a transparent conductive material, such as Tin Oxide (TO), Indium Tin Oxide (ITO), Indium Zinc Oxide (IZO), Indium Tin Zinc Oxide (ITZO), and the like, is formed on the protective film 140, and is patterned to form the pixel electrode 150 and the common electrode 160.

The pixel electrode 150 is electrically connected to the drain electrode 130b through the drain contact hole 140b. In this case, the pixel electrode 150 includes the pixel horizontal portion which constitutes a storage capacitor in a region overlapping the common line CL, and the plurality of pixel vertical portions 150a protruding from the pixel horizontal portion. In addition, the common electrode 160 is connected to the common line CL through the common contact hole 140b. The common electrode 160 includes the plurality of common vertical portions 160a alternating with the pixel vertical portions 150a, and the common horizontal portion connecting the plurality of common vertical portions 160a to one another.

The common vertical portions 160a and the pixel vertical portions 150a alternate with each other to generate a transverse field. In particular, the blocks between the pixel vertical portions 150a and the common vertical portions 160a are reduced in width by an equal-difference with increasing distance from either edge of the pixel area proximate to the data line DL or with decreasing distance to the center. Thus, on the basis of the center between two data lines Dl proximate to both edges of the pixel area, the blocks between the pixel vertical portions 150a and the common vertical portions 160a are symmetrical.

As is apparent from the above description, in the transparent display device and the manufacturing method thereof according to the present invention, the blocks between the pixel vertical portions 150a and the common vertical portions 160a are reduced or increased in width by an equal difference, which may reduce diffraction grating due to the pixel vertical portions 150a and the common vertical portions 160a in each pixel area. Thereby, improved diffraction and consequently, improved visibility may be achieved.

Further, even if the blocks between the pixel vertical portions 150a and the common vertical portions 160a are reduced or increased in width by an equal difference, the sum of the widths of the blocks between the pixel vertical portions 150a and the common vertical portions 160a in each pixel area is constant. Thus, the number of blocks between the pixel vertical portions 150a and the common vertical portions 160a in each pixel area and the opening rate of the pixel area are constant, which may prevent variation in display characteristics.

It will be apparent that, although the preferred embodiments have been shown and described above, the invention is not limited to the above-described specific embodiments, and various modifications and variations can be made by those skilled in the art without departing from the gist of the appended claims. Thus, it is intended that the modifications and variations should not be understood independently of the technical sprit or prospect of the invention.

What is claimed is:

1. A transparent display device comprising:
   gate lines and data lines formed on a substrate, the gate lines and the data lines crossing each other with a gate insulator film interposed therebetween to define pixel areas;
   common lines formed on the substrate, the common lines being parallel to the gate lines;
   thin film transistors formed in the respective pixel areas;
   pixel electrodes connected to the thin film transistors; and
   common electrodes connected to the common lines, the common electrodes alternating with the pixel electrodes,
   wherein a width of each block disposed between each of the pixel electrodes and the common electrodes is sequentially varied by an equal amount with an increasing distance from both edges of each pixel area to a center of the pixel area, and
   wherein the equal amount is within a range of 0.5 μm to 1 μm.

2. The device according to claim 1, wherein the blocks between the pixel electrodes and the common electrodes are symmetrical on the basis of the center between the two data lines proximate to both edges of the pixel area.

3. The device according to claim 1, wherein the width of each block disposed between each of the pixel electrodes and the common electrodes is sequentially reduced or increased by an equal amount with an increasing distance from both edges of each pixel area to a center of the pixel area.

4. A transparent display device comprising:
   gate lines and common lines on a substrate, the gate lines and the common lines being parallel to each other;
   a gate insulator film on the substrate including the gate lines and the common lines;
   data lines on the gate insulator film, the data lines crossing the gate lines to define pixel areas;
   thin film transistors in the respective pixel areas;
   a protective film on the substrate to cover the data lines and the thin film transistors;
   pixel electrodes on the protective film within each pixel area, the pixel electrodes connected to the thin film transistors; and
   common electrodes on the protective film within each pixel area, the common electrodes connected to the common lines, the common electrodes alternating with the pixel electrodes,
   wherein a width of each block disposed between each of the pixel electrodes and the common electrodes is sequentially varied by an equal amount with an increasing distance from both edges of each pixel area to a center of the pixel area, and
   wherein the equal amount is within a range of 0.5 μm to 1 μm.

5. The device according to claim 4, further comprising:
   drain contact holes in the protective film on drain electrodes of the thin film transistors; and
   common contact holes in the protective film and the gate insulator film on the common lines,
   wherein the pixel electrodes are connected to the drain electrodes of the thin film transistors through the drain contact holes, and the common electrodes are connected to the common lines through the common contact holes.

6. The device according to claim 4, wherein the blocks between the pixel electrodes and the common electrodes are symmetrical on the basis of the center between the two data lines proximate to both edges of the pixel area.

7. The device according to claim 4, wherein each of the pixel electrodes includes a pixel horizontal portion which constitutes a storage capacitor in a region overlapping the common line, and a plurality of pixel vertical portions protruding from the pixel horizontal portion, and
   wherein each of the common electrode includes a plurality of common vertical portions alternating with the pixel vertical portions, and a common horizontal portion connecting the plurality of common vertical portions to one another.

8. The device according to claim 7, wherein blocks between the pixel vertical portions and the common vertical portions are symmetrical on the basis of the center between the two data lines proximate to both edges of the pixel area.

9. The device according to claim 4, wherein the width of each block disposed between each of the pixel electrodes and the common electrodes is sequentially reduced or increased by an equal amount with an increasing distance from both edges of each pixel area to a center of the pixel area.

10. A manufacturing method of a transparent display device, comprising:
    forming gate lines and common lines on a substrate, the gate lines and the common lines being parallel to each other;
    forming a gate insulator film on the substrate to cover the gate lines and the common lines;
    forming data lines on the gate insulator film, the data lines crossing the gate lines to define pixel areas;
    forming thin film transistors in the respective pixel areas;
    forming pixel electrodes connected to the thin film transistors; and
    forming common electrodes connected to the common lines, the common electrodes alternating with the pixel electrodes,
    wherein a width of each block disposed between each of the pixel electrodes and the common electrodes is sequentially varied by an equal amount with an increasing distance from both edges of each pixel area to a center of the pixel area, and
    wherein the equal amount is within a range of 0.5 μm to 1 μm.

11. The method according to claim 10, wherein the blocks between the pixel electrodes and the common electrodes are symmetrical on the basis of the center between the two data lines proximate to both edges of the pixel area.

* * * * *